United States Patent
Sugawara et al.

(10) Patent No.: US 11,085,974 B2
(45) Date of Patent: Aug. 10, 2021

(54) ANOMALY DETECTION DEVICE AND ANOMALY DETECTION METHOD

(71) Applicant: ALPS ALPINE CO., LTD., Toyko (JP)

(72) Inventors: Daisaku Sugawara, Miyagi (JP); Toru Tanaka, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/849,133

(22) Filed: Apr. 15, 2020

(65) Prior Publication Data

US 2020/0241079 A1 Jul. 30, 2020

Related U.S. Application Data

(63) Continuation of application No. PCT/JP2018/032652, filed on Sep. 3, 2018.

(30) Foreign Application Priority Data

Oct. 23, 2017 (JP) .............................. JP2017-204583

(51) Int. Cl.
*G01R 31/50* (2020.01)
*G01R 31/54* (2020.01)
(Continued)

(52) U.S. Cl.
CPC ............... *G01R 31/54* (2020.01); *G01D 5/12* (2013.01); *G01R 31/52* (2020.01); *H01C 10/00* (2013.01)

(58) Field of Classification Search
CPC .................................. G01R 31/54; G01R 31/52
See application file for complete search history.

(56) References Cited

U.S. PATENT DOCUMENTS 3,810,008 A * 5/1974 Motoda ................. G01R 31/50
324/549
4,834,201 A * 5/1989 Miyazaki ............... B62D 5/049
180/404
(Continued)

FOREIGN PATENT DOCUMENTS

JP H03-202784 9/1991
JP H06-167303 6/1994
(Continued)

OTHER PUBLICATIONS

International Search Report for PCT/JP2018/032652 dated Oct. 2, 2018.

*Primary Examiner* — Walter L Lindsay, Jr.
*Assistant Examiner* — Milton Gonzalez
(74) *Attorney, Agent, or Firm* — IPUSA, PLLC

(57) ABSTRACT

An anomaly detection device detects an anomaly of a potentiometer including a resistor and a movable terminal that moves while contacting the resistor. The anomaly detection device includes a first applier that applies, to one end of the resistor, a first voltage in a first detection period and a second voltage in a second detection period that is consecutive to the first detection period; a second applier that applies, to another end of the resistor, the first voltage in the first detection period and the second voltage in the second detection period; a voltage detector that detects an output voltage from the movable terminal; and an anomaly detector that detects a contact failure of the movable terminal based on the output voltage detected by the voltage detector when an applied voltage applied by each of the first applier and the second applier is changed.

9 Claims, 7 Drawing Sheets

(51) Int. Cl.
*G01D 5/12* (2006.01)
*G01R 31/52* (2020.01)
*H01C 10/00* (2006.01)

(56) References Cited

U.S. PATENT DOCUMENTS

| | | | | |
|---|---|---|---|---|
| 4,987,372 | A | * | 1/1991 | Ofori-Tenkorang ... G01R 27/02 324/705 |
| 6,181,141 | B1 | * | 1/2001 | Juntunen ................. G01R 27/08 324/525 |
| 7,982,473 | B2 | | 7/2011 | Virtanen |
| 9,255,951 | B2 | * | 2/2016 | Saruwatari ............. G01R 27/14 |
| 9,429,614 | B2 | * | 8/2016 | Jefferies ................. G01R 31/54 |
| 2004/0228065 | A1 | | 11/2004 | Hoegener et al. |

FOREIGN PATENT DOCUMENTS

| | | |
|---|---|---|
| JP | H10-103910 | 4/1998 |
| JP | H11-037708 | 2/1999 |
| JP | 2008-528990 | 7/2008 |

\* cited by examiner

POWER SHORT-CIRCUIT

GROUND SHORT-CIRCUIT

T21 SHORT-CIRCUIT

T22 SHORT-CIRCUIT

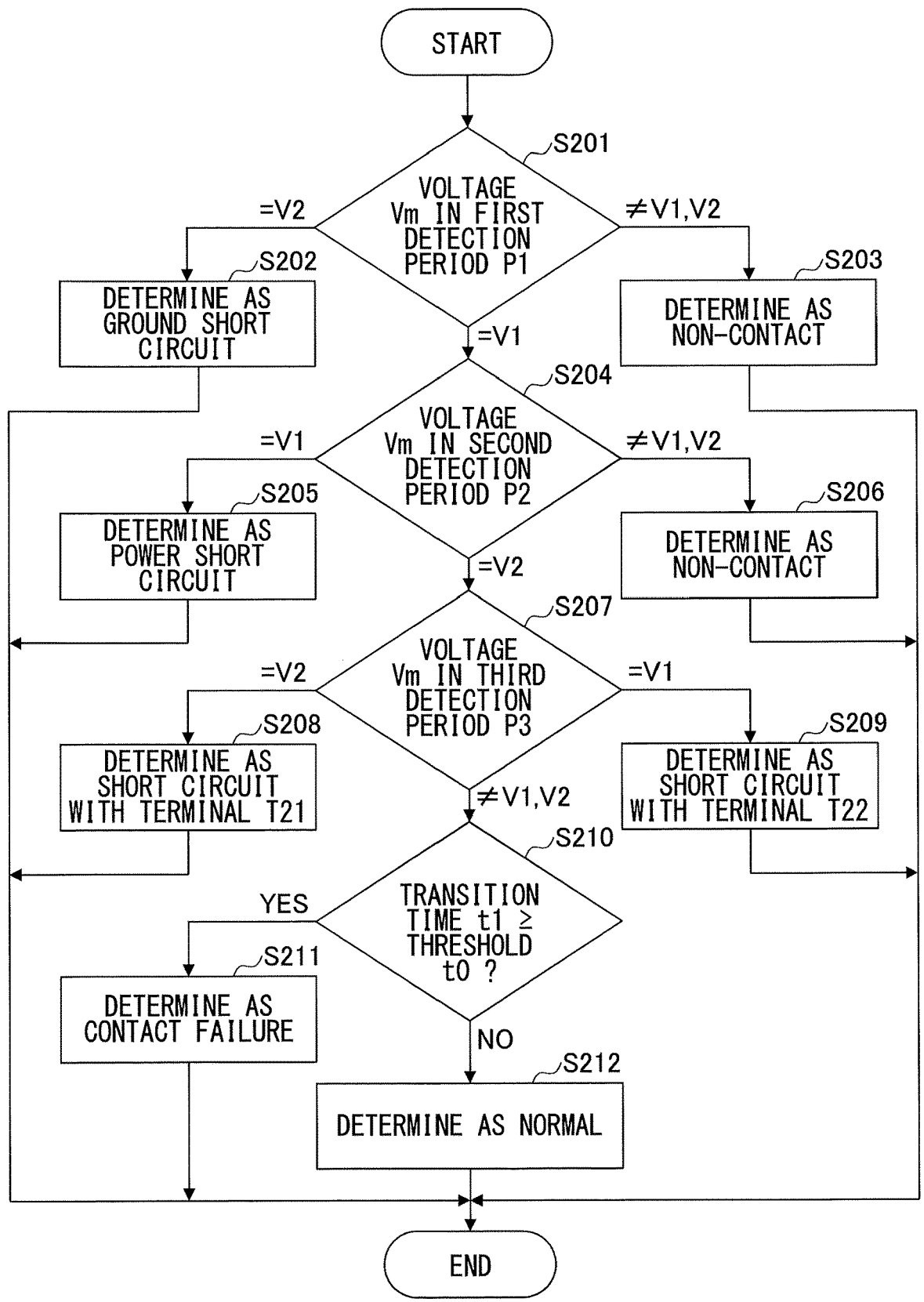

ANOMALY DETECTION DEVICE AND ANOMALY DETECTION METHOD

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2018/032652, filed on Sep. 3, 2018, which is based on and claims priority to Japanese Patent Application No. 2017-204583 filed on Oct. 23, 2017, the entire contents of which are incorporated herein by reference.

BACKGROUND OF THE INVENTION

1. Field of the Invention

An aspect of this disclosure relates to an anomaly detection device and an anomaly detection method.

2. Description of the Related Art

There is a known anomaly detection device that detects a voltage of a movable terminal of a potentiometer and detects an anomaly of the potentiometer such as a disconnection or a short circuit based on the detected voltage (see, for example, Japanese Unexamined Patent Application Publication No. H11-037708 and Japanese Unexamined Patent Application Publication No. H10-103910).

However, although the related-art anomaly detection device can detect a short circuit between the movable terminal and a power supply and a short circuit between the movable terminal and a ground, the related-art anomaly detection device cannot detect a contact failure of the movable terminal that occurs frequently in the potentiometer.

SUMMARY OF THE INVENTION

In an aspect of this disclosure, there is provided an anomaly detection device for a potentiometer including a resistor and a movable terminal that moves while contacting the resistor. The anomaly detection device includes a first applier that applies, to one end of the resistor, a first voltage in a first detection period and a second voltage in a second detection period that is consecutive to the first detection period; a second applier that applies, to another end of the resistor, the first voltage in the first detection period and the second voltage in the second detection period; a voltage detector that detects an output voltage from the movable terminal; and an anomaly detector that detects a contact failure of the movable terminal based on the output voltage detected by the voltage detector when an applied voltage applied by each of the first applier and the second applier is changed.

BRIEF DESCRIPTION OF THE DRAWINGS

FIG. 7 is a flowchart illustrating an example of an anomaly detection process.

DESCRIPTION OF THE PREFERRED EMBODIMENTS

An aspect of this disclosure makes it possible to provide an anomaly detection device that can detect a contact failure of a movable terminal in a potentiometer.

Embodiments of the present invention are described below with reference to the accompanying drawings. In the specification and the drawings related to the embodiments, the same reference number is assigned to components having substantially the same function and configuration, and repeated description of those components is omitted.

Figure 1:
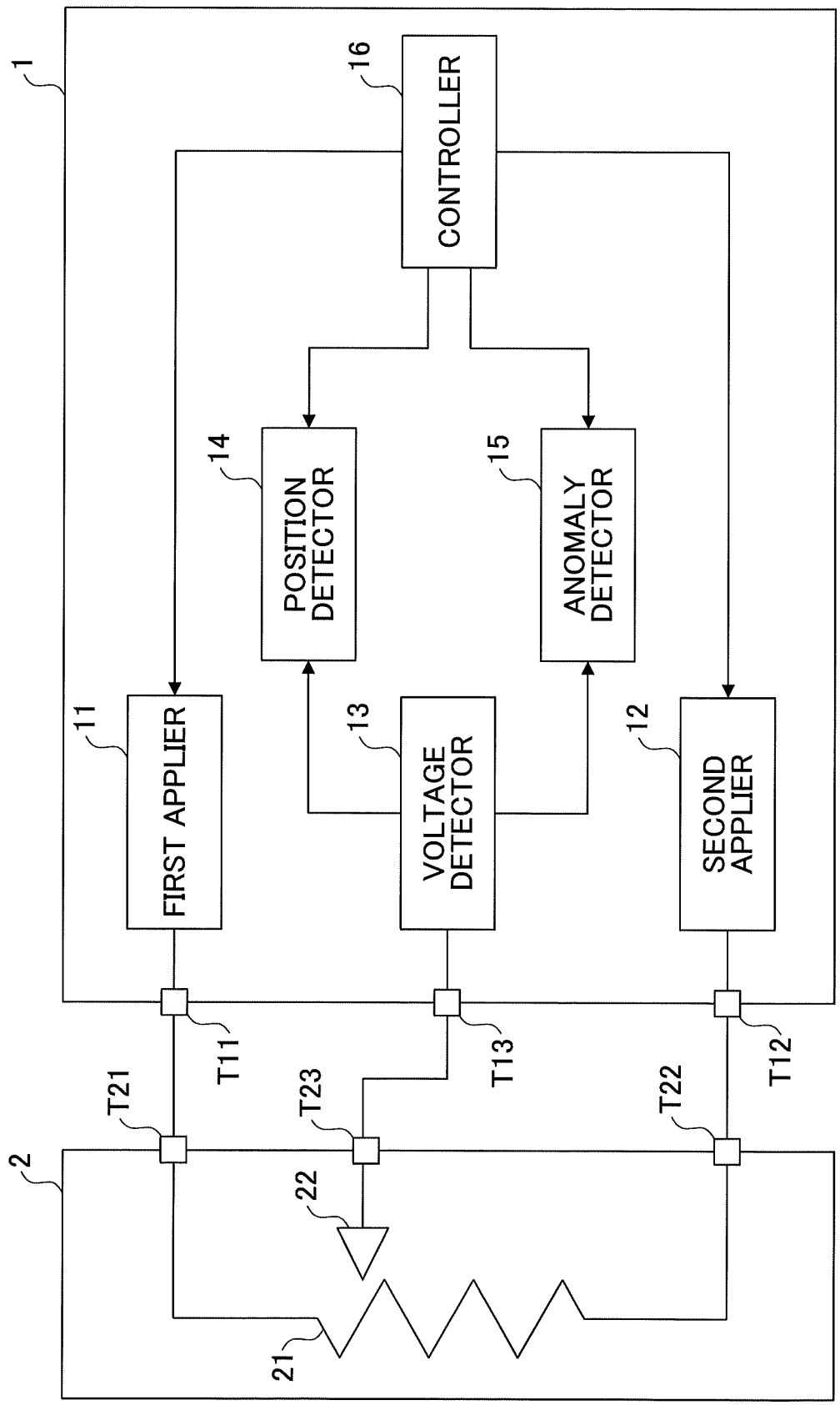
FIG. 1 is a drawing illustrating an example of a configuration of an anomaly detection device.

An anomaly detection device 1 according to an embodiment is described with reference to FIGS. 1 through 7. FIG. 1 is a drawing illustrating examples of the anomaly detection device 1 and a potentiometer 2. First, the potentiometer 2 is described.

The potentiometer 2 includes a resistor 21, a movable terminal 22, and terminals T21 through T23. In the example of FIG. 1, it is assumed that the potentiometer 2 is a linear potentiometer for detecting a position of the movable terminal 22 on a straight line. Alternatively, the potentiometer 2 may be a rotary potentiometer for detecting a rotation angle of the movable terminal 22.

One end of the resistor 21 is connected to the terminal T21, and the other end of the resistor 21 is connected to the terminal T22. A voltage is applied to the resistor 21 by the anomaly detection device 1.

The movable terminal 22 moves according to a user operation while contacting the resistor 21. One end of the movable terminal 22 is in contact with the resistor 21, and the other end of the movable terminal 22 is connected to the terminal T23. A voltage Vm of the movable terminal 22 is detected by the anomaly detection device 1.

Next, the anomaly detection device 1 is described. The anomaly detection device 1 detects a position of the movable terminal 22 of the potentiometer 2 and detects an anomaly of the potentiometer 2. That is, the anomaly detection device 1 also functions as a position detection device that detects the position of the movable terminal 22.

Anomalies of the potentiometer 2 include a short circuit (hereafter referred to as a "power short circuit") between the movable terminal 22 and a high-voltage power supply, a short-circuit (hereafter referred to as a "ground short circuit") between the movable terminal 22 and a low-voltage power supply, a short circuit between the movable terminal 22 and one or the other end of the resistor 21, a separation (floating) of the movable terminal 22 from the resistor 21, and a contact failure of the movable terminal 22 with the resistor 21. A contact failure of the movable terminal 22 indicates a state where the resistance between the movable terminal 22 and the resistor 21 has increased due to, for example, a foreign object that is stuck between the movable terminal 22 and the resistor 21.

The anomaly detection device 1 is implemented by a computer including a central processing unit (CPU), a read-only memory (ROM), and a random access memory (RAM). The anomaly detection device 1 may be implemented by a microcomputer such as a micro control unit (MCU) or a general-purpose computer such as a personal computer (PC).

The anomaly detection device 1 of FIG. 1 has a functional configuration that includes a first applier 11, a second applier 12, a voltage detector 13, a position detector 14, an anomaly detector 15, a controller 16, and terminals T11 through T13. The first applier 11, the second applier 12, and the voltage detector 13 are implemented by hardware; and the position detector 14, the anomaly detector 15, and the controller 16 are implemented by executing programs by the CPU. Alternatively, the position detector 14, the anomaly detector 15, and the controller 16 may be implemented by hardware.

The first applier 11 is connected to the terminal T11 that is connected to the terminal T21 of the potentiometer 2. That is, the first applier 11 is connected to one end of the resistor 21 via the terminals T11 and T21. The first applier 11 applies a first voltage V1 or a second voltage V2 to one end of the resistor 21 according to an instruction from the controller 16.

The first voltage V1 is higher than the second voltage V2. A first voltage source that supplies the first voltage V1 corresponds to the high-voltage power supply, and a second voltage source that supplies the second voltage V2 corresponds to the low-voltage power supply. The first applier 11 is implemented by a switching circuit that connects the terminal T11 to the first voltage source or the second voltage source according to an instruction from the controller 16. When the anomaly detection device 1 is implemented by an MCU, the first applier 11 corresponds to an output port. As non-limiting examples, the first voltage source is a power supply, the second voltage source is the ground, the first voltage V1 is 5 V, and the second voltage V2 is 0 V.

The second applier 12 is connected to the terminal T12 that is connected to the terminal T22 of the potentiometer 2. That is, the second applier 12 is connected to the other end of the resistor 21 via the terminals T12 and T22. The second applier 12 applies the first voltage V1 or the second voltage V2 to the other end of the resistor 21 according to an instruction from the controller 16.

The second applier 12 is implemented by a switching circuit that connects the terminal T12 to the first voltage source or the second voltage source according to an instruction from the controller 16. When the anomaly detection device 1 is implemented by an MCU, the second applier 12 corresponds to an output port.

The voltage detector 13 is connected to the terminal T13 connected to the terminal T23 of the potentiometer 2. That is, the voltage detector 13 is connected to the other end of the movable terminal 22 via the terminals T13 and T23. The voltage detector 13 is implemented by an analog to digital converter (ADC) such as a flash ADC, a pipeline ADC, or a successive approximation ADC, and detects the voltage Vm of the movable terminal 22 applied to the terminal T13 at a predetermined sampling interval. The voltage Vm corresponds to an output voltage from the movable terminal 22. When the anomaly detection device 1 is an MCU, the voltage detector 13 corresponds to an input port.

The position detector 14 detects the position of the movable terminal 22 based on the voltage Vm of the movable terminal 22 detected by the voltage detector 13. The position detector 14 includes a position table indicating the correspondence between values of the voltage Vm and positions, and determines a position corresponding to the voltage Vm of the movable terminal 22 detected by the voltage detector 13 as the position of the movable terminal 22.

The anomaly detector 15 detects an anomaly of the potentiometer 2 based on the voltage Vm of the movable terminal 22 detected by the voltage detector 13. An anomaly detection method is described later.

The controller 16 controls the operations of the entire anomaly detection device 1. A control method is described later.

Figure 2:
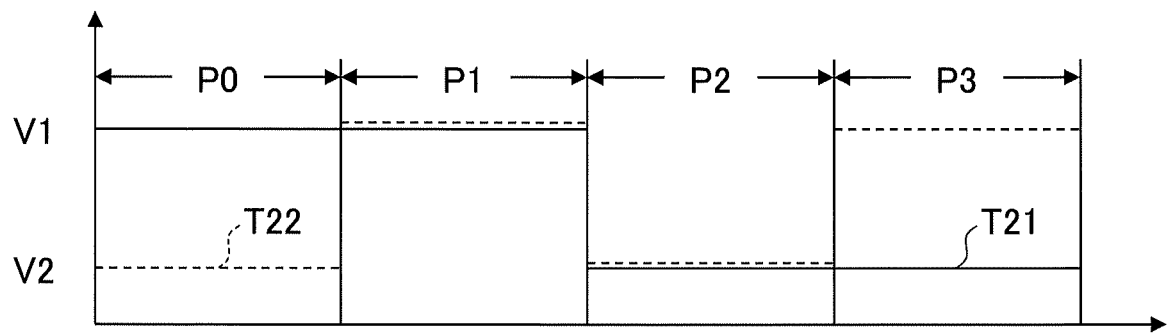
FIG. 2 is a drawing illustrating examples of voltages applied to a resistor by a first applier and a second applier.

Next, an outline of the operation of the anomaly detection device 1 is described. FIG. 2 is a drawing illustrating examples of voltages applied to the resistor 21 by the first applier 11 and the second applier 12. In FIG. 2, a solid line indicates a voltage applied by the first applier 11 to one end (terminal T21) of the resistor 21, and a dotted line indicates a voltage applied by the second applier 12 to the other end (terminal T22) of the resistor 21. As illustrated in FIG. 2, the anomaly detection device 1 has operation periods including a position detection period P0, a first detection period P1, a second detection period P2, and a third detection period P3.

The position detection period P0 is a period in which the anomaly detection device 1 detects a position of the movable terminal 22. During the position detection period P0, the first applier 11 applies the first voltage V1 to one end of the resistor 21, and the second applier 12 applies the second voltage V2 to the other end of the resistor 21.

The first detection period P1 is a first period in which the anomaly detection device 1 detects an anomaly of the potentiometer 2. During the first detection period P1, the first applier 11 applies the first voltage V1 to one end of the resistor 21, and the second applier 12 applies the first voltage V1 to the other end of the resistor 21.

The second detection period P2 is a second period in which the anomaly detection device 1 detects an anomaly of the potentiometer 2. During the second detection period P2, the first applier 11 applies the second voltage V2 to one end of the resistor 21, and the second applier 12 applies the second voltage V2 to the other end of the resistor 21.

The third detection period P3 is a third period in which the anomaly detection device 1 detects an anomaly of the potentiometer 2. During the third detection period P3, the first applier 11 applies the second voltage V2 to one end of the resistor 21, and the second applier 12 applies the first voltage V1 to the other end of the resistor 21. That is, the third detection period P3 corresponds to a period in which voltages that are opposite to the voltages applied in the position detection period P0 are applied.

The anomaly detection device 1 repeatedly performs an operation cycle that consists of the position detection period P0, the first detection period P1, the second detection period P2, and the third detection period P3. A time necessary for one operation cycle is, for example but is not limited to, 5 msec. The position detection period P0, the first detection period P1, the second detection period P2, and the third detection period P3 may have the same time length or different time lengths. Also, the order of the position detection period P0, the first detection period P1, the second detection period P2, and the third detection period P3 in one operation cycle is not limited to the example in FIG. 2.

Figure 3A:
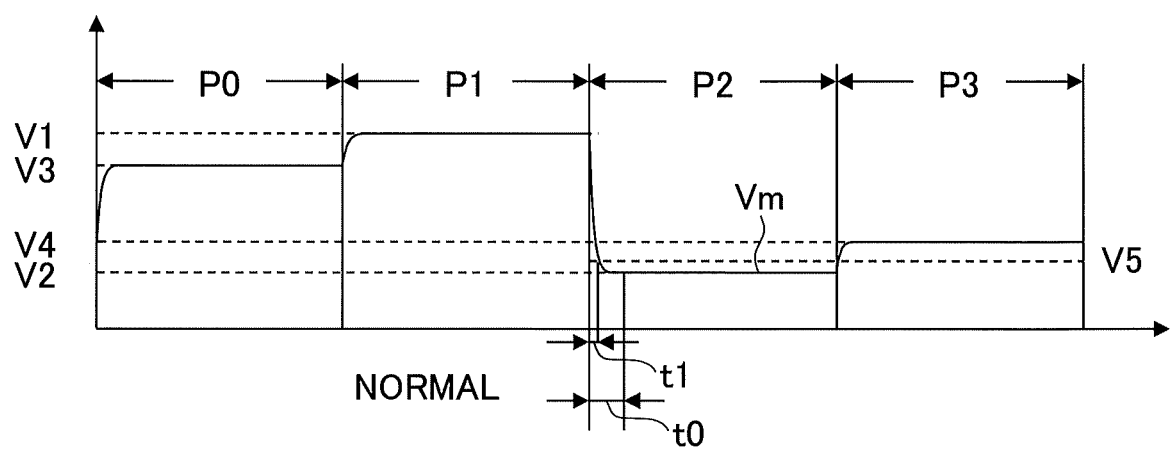
FIG. 3A is a drawing illustrating a voltage corresponding to a state of a potentiometer.
Figure 3B:
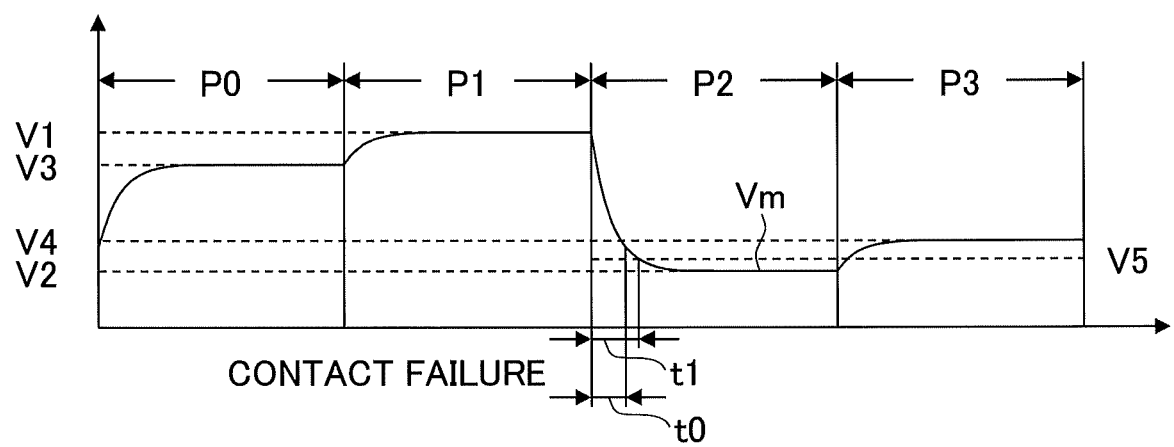
FIG. 3B is a drawing illustrating a voltage corresponding to a state of the potentiometer.
Figure 3C:
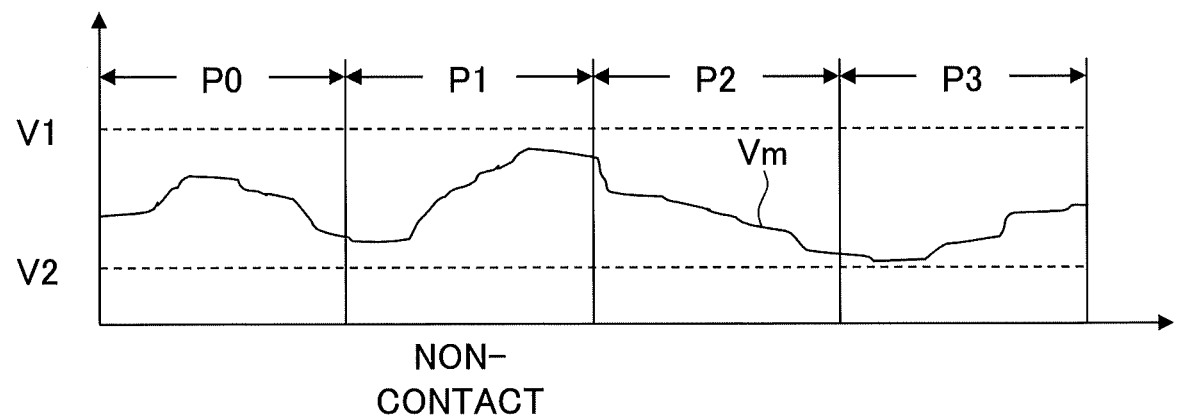
FIG. 3C is a drawing illustrating a voltage corresponding to a state of the potentiometer.
Figure 4A:
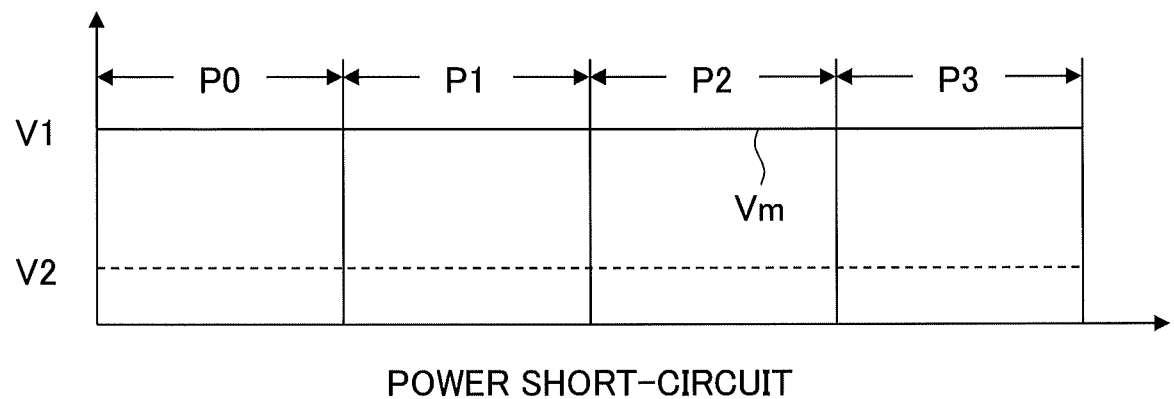
FIG. 4A is a drawing illustrating a voltage corresponding to a state of the potentiometer.
Figure 4B:
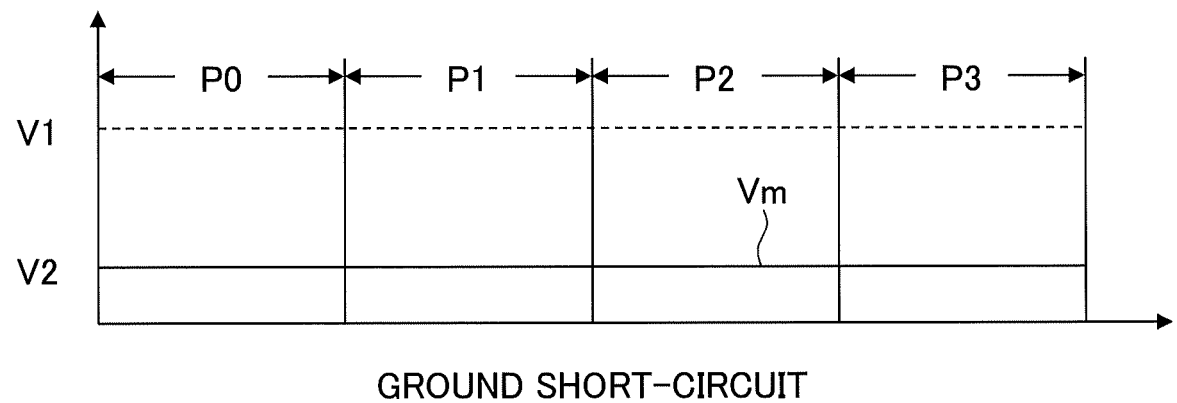
FIG. 4B is a drawing illustrating a voltage corresponding to a state of the potentiometer.
Figure 5A:
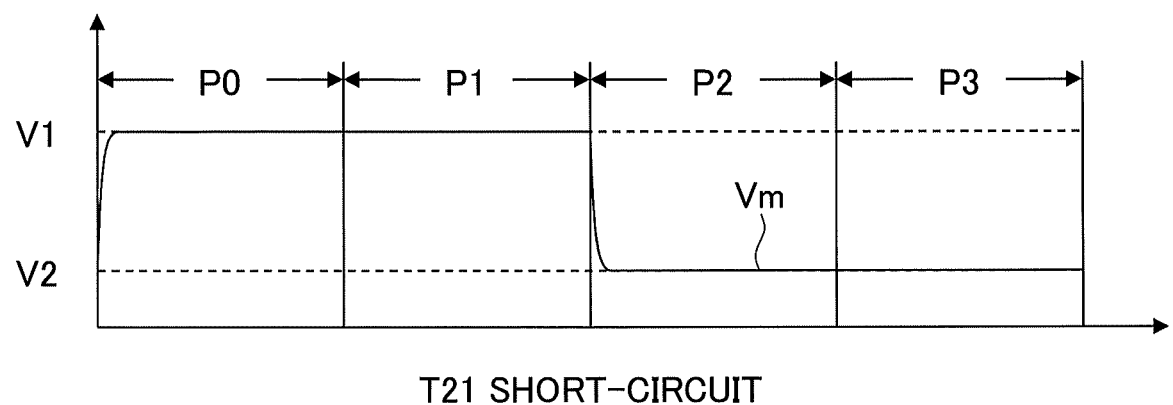
FIG. 5A is a drawing illustrating a voltage corresponding to a state of the potentiometer.
Figure 5B:
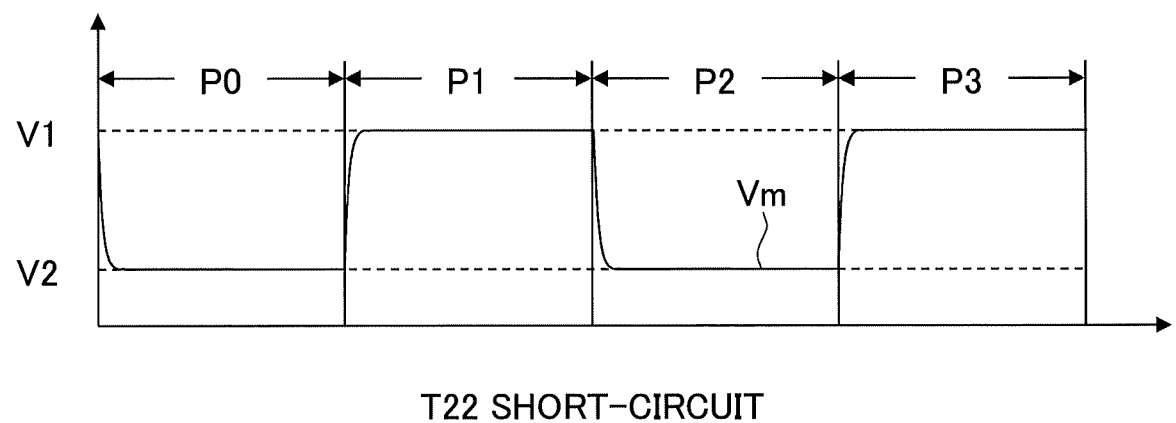
FIG. 5B is a drawing illustrating a voltage corresponding to a state of the potentiometer.

Next, a method performed by the anomaly detector 15 to detect an anomaly of the potentiometer 2 is described. FIGS. 3A through 3C, FIGS. 4A and 4B, and FIGS. 5A and 5B are drawings illustrating voltages Vm corresponding to states of the potentiometer 2. FIG. 3A illustrates a voltage Vm when the potentiometer 2 is in a normal state, FIG. 3B illustrates a voltage Vm when a contact failure of the movable terminal 22 occurs, and FIG. 3C illustrates a voltage Vm when the movable terminal 22 is in a non-contact state. FIG. 4A illustrates a voltage Vm when a power short circuit of the movable terminal 22 occurs, and FIG. 4B illustrates a voltage Vm when a ground short circuit of the movable terminal 22 occurs. FIG. 5A illustrates a voltage Vm when a short circuit occurs between the movable terminal 22 and one end (terminal T21) of the resistor 21, and FIG. 5B illustrates a voltage Vm when a short circuit occurs between the movable terminal 22 and the other end (terminal T22) of the resistor 21. Here, it is assumed that the voltage Vm is higher than the second voltage V2 and lower than the first voltage V1. This indicates that the movable terminal 22 can move in a range between a position corresponding to the first voltage V1 and a position corresponding to the second voltage V2 (excluding the positions corresponding to the first voltage V1 and the second voltage V2).

When the potentiometer 2 is in a normal state, as illustrated in FIG. 3A, the voltage Vm becomes a voltage V3 corresponding to the position of the movable terminal 22 in the position detection period P0, becomes the first voltage V1 in the first detection period P1, becomes the second voltage V2 in the second detection period P2, and becomes a voltage V4 corresponding to the position of the movable terminal 22 in the third detection period P3. In the position detection period P0 and the third detection period P3, opposite voltages are applied to the resistor 21. Accordingly, the voltage V4 is obtained by inverting the voltage V3 with respect to an intermediate voltage between the first voltage V1 and the second voltage V2. That is, V4=V1+V2−V3.

When a contact failure of the movable terminal 22 occurs, as illustrated in FIG. 3B, the voltage Vm becomes the voltage V3 corresponding to the position of the movable terminal 22 in the position detection period P0, becomes the first voltage V1 in the first detection period P1, becomes the second voltage V2 in the second detection period P2, and becomes the voltage V4 corresponding to the position of the movable terminal 22 in the third detection period P3. However, when a contact failure of the movable terminal 22 occurs, a transition time (rise time and fall time) of the voltage Vm, which is observed when an applied voltage applied by each of the first applier 11 and the second applier 12 is changed, becomes longer than the transition time in a case where the potentiometer 2 is in the normal state. This is because the current flowing through the movable terminal 22 decreases due to an increase in the resistance between the resistor 21 and the movable terminal 22, and the time necessary to charge and discharge a sampling capacitance of a sample-and-hold circuit of the voltage detector 13 (ADC) increases. Accordingly, the anomaly detector 15 can detect the occurrence of a contact failure of the movable terminal 22 based on the transition time of the voltage Vm observed when an applied voltage applied by each of the first applier 11 and the second applier 12 is changed. Specifically, the anomaly detector 15 may determine that a contact failure of the movable terminal 22 has occurred if a transition time t1 observed when the applied voltage is changed from the voltage V1 to the voltage V2 is greater than or equal to a threshold t0. The transition time t1 is a period between the start of the second detection period P2 and a time when the voltage Vm reaches a preset voltage V5. The threshold t0 indicates a preset transition time used to determine whether a contact failure of the movable terminal 22 has occurred.

When the order of the first detection period P1 and the second detection period P2 in the operation cycle of the anomaly detection device 1 is opposite to the order illustrated in FIGS. 3A through 3C, the anomaly detector 15 may detect a contact failure of the movable terminal 22 based on the transition time observed when the applied voltage is changed from the voltage V2 to the voltage V1. As described above, a contact failure of the movable terminal 22 is detected based on a transition time of the voltage Vm observed when the voltage applied by each of the first applier 11 and the second applier 12 is changed between the voltage V1 and the voltage V2. Accordingly, in the operation cycle of the anomaly detection device 1, the first detection period P1 and the second detection period P2 are preferably performed consecutively.

When the movable terminal 22 is not in contact with the resistor 21, i.e., when the movable terminal 22 is separated from the resistor 21, the movable terminal 22 becomes an open end, and the voltage Vm becomes unstable as illustrated in FIG. 3C. More specifically, in the first detection period P1 and the second detection period P2, the voltage Vm does not become the first voltage V1 nor the second voltage V2. Therefore, the anomaly detector 15 can detect the separation of the movable terminal 22 based on the voltage Vm detected in the first detection period P1 or the second detection period P2. Specifically, the anomaly detector 15 may determine that the movable terminal 22 is in a non-contact state when the voltage Vm detected in the first detection period P1 or the second detection period P2 is neither the first voltage V1 nor the second voltage V2.

When a power short circuit occurs in the potentiometer 2, the voltage Vm is constantly at the first voltage V1 as illustrated in FIG. 4A. As can be seen from FIGS. 3A through 3C, FIGS. 4A and 4B, and FIGS. 5A and 5B, in the second detection period P2, the voltage Vm becomes the first voltage V1 only when a power short circuit occurs. Therefore, the anomaly detector 15 can detect the occurrence of a power short circuit based on the voltage Vm detected in the second detection period P2. Specifically, the anomaly detector 15 may determine that a power short circuit has occurred when the voltage Vm detected in the second detection period P2 is the first voltage V1.

When a ground short circuit occurs in the potentiometer 2, the voltage Vm is constantly at the second voltage V2 as illustrated in FIG. 4B. As can be seen from FIGS. 3A through 3C, FIGS. 4A and 4B, and FIGS. 5A and 5B, in the first detection period P1, the voltage Vm becomes the second voltage V2 only when a ground short circuit occurs. Therefore, the anomaly detector 15 can detect the occurrence of a ground short circuit based on the voltage Vm detected in the first detection period P1. Specifically, the anomaly detector 15 may determine that a ground short circuit has occurred when the voltage Vm detected in the first detection period P1 is the second voltage V2.

When a short circuit occurs between the movable terminal 22 and the terminal T21, as illustrated in FIG. 5A, the voltage Vm becomes the first voltage V1 in the position detection period P0 and the first detection period P1, and becomes the second voltage V2 in the second detection period P2 and the third detection period P3. As can be seen from FIGS. 3A through 3C, FIGS. 4A and 4B, and FIGS. 5A and 5B, only when a short circuit occurs between the movable terminal 22 and the terminal T21, the voltage Vm becomes the first voltage V1 in the first detection period P1 and becomes the second voltage V2 in the third detection period P3. Therefore, the anomaly detector 15 can detect a short circuit between the movable terminal 22 and the terminal T21 based on the voltage Vm detected in the first detection period P1 and the third detection period P3.

Specifically, the anomaly detector 15 may determine that a short circuit has occurred between the movable terminal 22 and the terminal T21 when the voltage Vm detected in the first detection period P1 is the first voltage V1 and the voltage Vm detected in the third detection period P3 is the second voltage V2.

When a short circuit occurs between the movable terminal 22 and the terminal T22, as illustrated in FIG. 5B, the voltage Vm becomes the second voltage V2 in the position detection period P0 and the second detection period P2 and becomes the first voltage V1 in the first detection period P1 and the third detection period P3. As can be seen from FIGS. 3A through 3C, FIGS. 4A and 4B, and FIGS. 5A and 5B, only when a short circuit occurs between the movable terminal 22 and the terminal T22, the voltage Vm becomes the second voltage V2 in the second detection period P2 and becomes the first voltage V1 in the third detection period P3. Therefore, the anomaly detector 15 can detect a short circuit between the movable terminal 22 and the terminal T22 based on the voltage Vm detected in the second detection period P2 and the third detection period P3. Specifically, the anomaly detector 15 may determine that a short circuit has occurred between the movable terminal 22 and the terminal T22 when the voltage Vm detected in the second detection period P2 is the second voltage V2 and the voltage Vm detected in the third detection period P3 is the first voltage V1.

Figure 6:
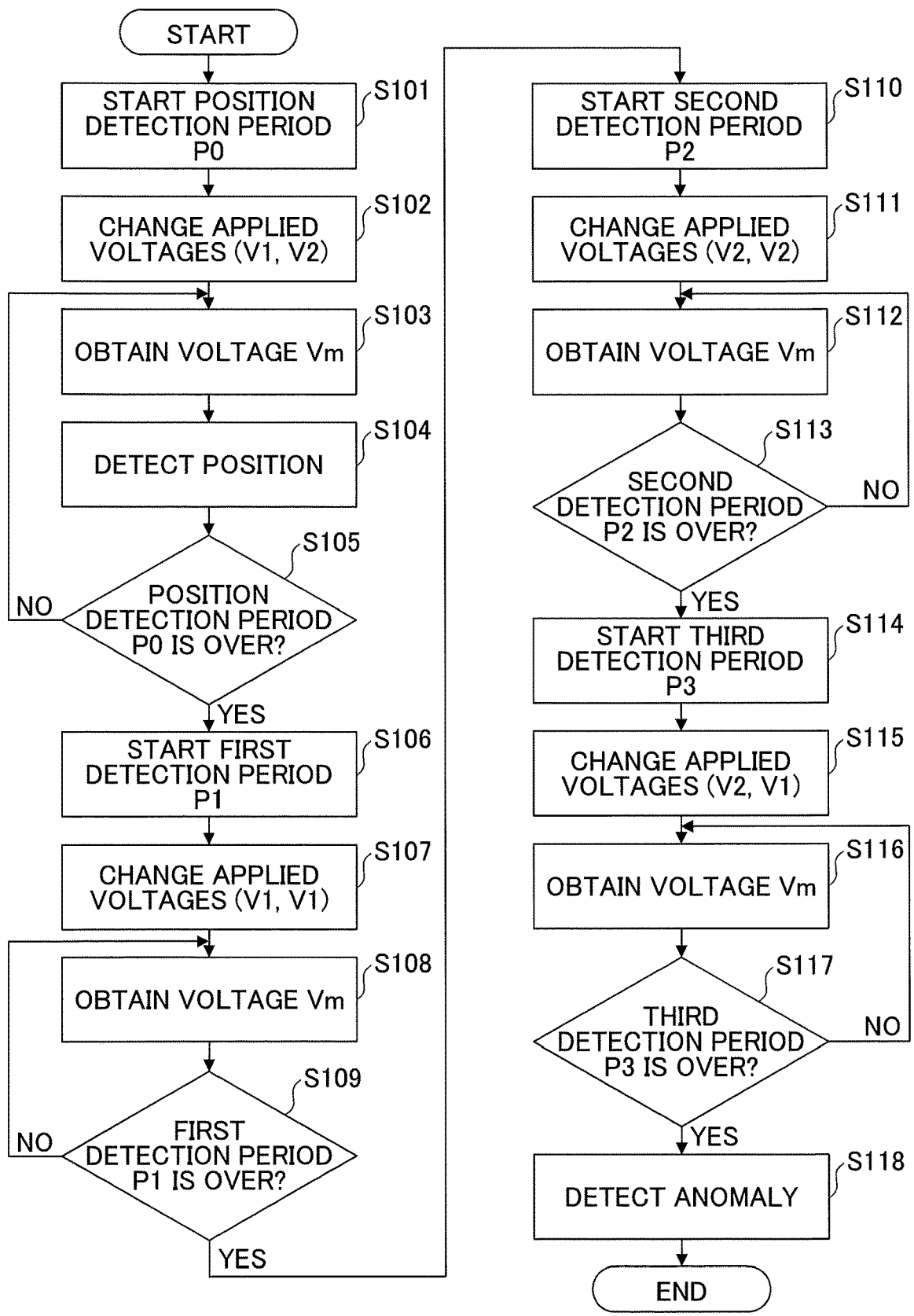
FIG. 6 is a flowchart illustrating an example of a process performed by an anomaly detection device.

Next, a process performed by the anomaly detection device 1 is described. FIG. 6 is a flowchart illustrating an example of steps of a process performed by the anomaly detection device 1. The process of FIG. 6 corresponds to a process performed by the anomaly detection device 1 in one operation cycle. While in operation, the anomaly detection device 1 repeats the process of FIG. 6. Here, it is assumed that during the process of FIG. 6, the voltage detector 13 continues to detect the voltage Vm of the movable terminal 22 at a predetermined sampling interval.

When the start time of the position detection period P0 comes, the controller 16 causes the anomaly detection device 1 to start a process for the position detection period P0 (step S101). Specifically, the controller 16 instructs the first applier 11 to apply the first voltage V1, instructs the second applier 12 to apply the second voltage V2, and reports the start of the position detection period P0 to the position detector 14.

When instructed to change applied voltages, the first applier 11 and the second applier 12 change the applied voltages according to the instructions (step S102). Specifically, the first applier 11 applies the first voltage V1 to one end of the resistor 21, and the second applier 12 applies the second voltage V2 to the other end of the resistor 21.

On the other hand, when the start of the position detection period P0 is reported, the position detector 14 obtains the voltage Vm from the voltage detector 13 (step S103), and determines a position corresponding to the obtained voltage Vm as the position of the movable terminal 22 by referring to the position table (step S104). The position detector 14 repeats steps S103 and S104 at predetermined time intervals until the position detection period P0 ends (while step S105 is NO).

When the position detection period P0 ends (YES at step S105), the controller 16 causes the anomaly detection device 1 to start a process for the first detection period P1 (step S106). Specifically, the controller 16 instructs the first applier 11 and the second applier 12 to apply the first voltage V1 and reports the start of the first detection period P1 to the anomaly detector 15.

When instructed to change applied voltages, the first applier 11 and the second applier 12 change the applied voltages according to the instructions (step S107). Specifically, the first applier 11 and the second applier 12 apply the first voltage V1 to one end of the resistor 21 and the other end of the resistor 21, respectively.

On the other hand, when the start of the first detection period P1 is reported, the anomaly detector 15 obtains the voltage Vm from the voltage detector 13 (step S108). The anomaly detector 15 stores the obtained voltage Vm in chronological order as the voltage Vm detected in the first detection period P1. The anomaly detector 15 repeats step S108 at predetermined time intervals until the first detection period P1 ends (while step S109 is NO).

When the first detection period P1 ends (YES at step S109), the controller 16 causes the anomaly detection device 1 to start a process for the second detection period P2 (step S110). Specifically, the controller 16 instructs the first applier 11 and the second applier 12 to apply the second voltage V2 and reports the start of the second detection period P2 to the anomaly detector 15.

When instructed to change applied voltages, the first applier 11 and the second applier 12 change the applied voltages according to the instructions (step S111). Specifically, the first applier 11 and the second applier 12 apply the second voltage V2 to one end of the resistor 21 and the other end of the resistor 21, respectively.

On the other hand, when the start of the second detection period P2 is reported, the anomaly detector 15 obtains the voltage Vm from the voltage detector 13 (step S112). The anomaly detector 15 stores the obtained voltage Vm in chronological order as the voltage Vm detected in the second detection period P2. The anomaly detector 15 repeats step S112 at predetermined time intervals until the second detection period P2 ends (while step S113 is NO).

When the second detection period P2 ends (YES at step S113), the controller 16 causes the anomaly detection device 1 to start a process for the third detection period P3 (step S114). Specifically, the controller 16 instructs the first applier 11 to apply the second voltage V2, instructs the second applier 12 to apply the first voltage V1, and reports the start of the third detection period P3 to the anomaly detector 15.

When instructed to change applied voltages, the first applier 11 and the second applier 12 change the applied voltages according to the instructions (step S115). Specifically, the first applier 11 applies the second voltage V2 to one end of the resistor 21, and the second applier 12 applies the first voltage V1 to the other end of the resistor 21.

On the other hand, when the start of the third detection period P3 is reported, the anomaly detector 15 obtains the voltage Vm from the voltage detector 13 (step S116). The anomaly detector 15 stores the obtained voltage Vm in chronological order as the voltage Vm detected in the third detection period P3. The anomaly detector 15 repeats step S116 at predetermined time intervals until the third detection period P3 ends (while step S117 is NO).

When the third detection period P3 ends (YES at step S117), the controller 16 instructs the anomaly detector 15 to detect an anomaly. In response to the instruction to detect an anomaly, the anomaly detector 15 detects an anomaly of the potentiometer 2 based on voltages Vm detected in the first detection period P1, the second detection period P2, and the third detection period P3 (step S118).

FIG. 7 is a flowchart illustrating an example of steps of an anomaly detection process performed by the anomaly detector 15. The anomaly detection process of FIG. 7 corresponds to an internal process of step S118 in FIG. 6. Accordingly, at the start of the flowchart of FIG. 7, the anomaly detector 15 has already obtained voltages Vm detected in the first detection period P1, the second detection period P2, and the third detection period P3.

First, the anomaly detector 15 detects an anomaly based on the voltage Vm detected in the first detection period P1 (step S201). The anomaly detector 15 determines that a ground short circuit has occurred when the voltage Vm detected in the first detection period P1 is the second voltage V2 (step S202), and determines that the movable terminal 22 is in the non-contact state when the voltage Vm detected in the first detection period P1 is neither the first voltage V1 nor the second voltage V2 (step S203).

If the voltage Vm detected in the first detection period P1 is the first voltage V1, the anomaly detector 15 detects an anomaly based on the voltage Vm detected in the second detection period P2 (step S204). When the voltage Vm detected in the second detection period P2 is the first voltage V1, the anomaly detector 15 determines that a power short circuit has occurred (step S205). When the voltage Vm detected in the second detection period P2 is neither the first voltage V1 nor the second voltage V2, the anomaly detector 15 determines that the movable terminal 22 is in the non-contact state (step S206).

When the voltage Vm detected in the second detection period P2 is the second voltage V2, the anomaly detector 15 detects an anomaly based on the voltage Vm detected in the third detection period P3 (step S207). When the voltage Vm detected in the third detection period P3 is the second voltage V2, the anomaly detector 15 determines that a short circuit has occurred between the movable terminal 22 and one end (terminal T21) of the resistor 21 (step S208). When the voltage Vm detected in the third detection period P3 is the first voltage V1, the anomaly detector 15 determines that a short circuit has occurred between the movable terminal 22 and the other end (terminal T22) of the resistor 21 (step S209).

When the voltage Vm detected in the third detection period P3 is neither the first voltage V1 nor the second voltage V2, the anomaly detector 15 detects an anomaly based on the transition time t1 (step S210). When the transition time t1 is greater than or equal to the threshold t0 (YES at step S210), the anomaly detector 15 determines that a contact failure of the movable terminal 22 has occurred (step S211). When the transition time t1 is less than the threshold t0 (NO at step S210), the anomaly detector 15 determines that the potentiometer 2 is in the normal state (step S212).

With the above anomaly detection process, the anomaly detection device 1 can detect various types of anomalies of the potentiometer 2 including a contact failure of the movable terminal 22. In the example of FIG. 7, the anomaly detector 15 performs the entire anomaly detection process after the end of the third detection period P3. Alternatively, the anomaly detector 15 may be configured to perform the corresponding process after the end of each period. For example, the anomaly detector 15 may perform step S201 after the end of the first detection period P1 and perform step S204 after the end of the second detection period P2.

As described above, the anomaly detection device 1 of the present embodiment applies the first voltage V1 to the resistor 21 in the first detection period P1 and applies the second voltage V2 to the resistor 21 in the second detection period P2. With this configuration, the anomaly detection device 1 can detect a contact failure of the movable terminal 22 based on the transition time t1 of the voltage Vm observed when the applied voltage applied to the resistor 21 is changed. Also, the anomaly detection device 1 can detect anomalies such as a power short circuit and a ground short circuit of the movable terminal 22 and a separation of the movable terminal 22 from the resistor 21 based on voltages Vm of the movable terminal 22 detected in the first detection period P1 and the second detection period P2.

In the third detection period P3, the anomaly detection device 1 applies, to the resistor 21, voltages that are opposite to the voltages applied in the position detection period P0. With this configuration, the anomaly detection device 1 can detect a short circuit between the movable terminal 22 and one end or the other end of the resistor 21 based on voltages Vm of the movable terminal 22 detected in the first detection period P1, the second detection period P2, and the third detection period.

Because the related-art anomaly detection device cannot detect a contact failure of the movable terminal 22, the related-art anomaly detection device is used in a duplex configuration. On the other hand, because the anomaly detection device 1 of the present embodiment can detect a contact failure of the movable terminal 22, it is not necessary to use the anomaly detection device 1 in a duplex configuration. This in turn makes it possible to reduce the number of components of a system including the potentiometer 2 and to reduce the manufacturing costs and the failure rate of the system.

In the present embodiment, the anomaly detection device 1 may not have the third detection period P3. Even in this case, the anomaly detection device 1 can detect anomalies such as a contact failure, a power short circuit, and a ground short circuit of the movable terminal 22 and a separation of the movable terminal 22 from the resistor 21.

An anomaly detection device and an anomaly detection method according to the embodiment of the present invention are described above. However, the present invention is not limited to the specifically disclosed embodiment, and variations and modifications may be made without departing from the scope of the present invention.

What is claimed is:

1. An anomaly detection device for a potentiometer including a resistor and a movable terminal that moves while contacting the resistor, the anomaly detection device comprising:
   a first applier that applies, to one end of the resistor, a first voltage in a first detection period and a second voltage in a second detection period that is consecutive to the first detection period;
   a second applier that applies, to another end of the resistor, the first voltage in the first detection period and the second voltage in the second detection period;
   a voltage detector that detects an output voltage from the movable terminal; and
   an anomaly detector that detects a contact failure of the movable terminal based on the output voltage detected by the voltage detector when an applied voltage applied by each of the first applier and the second applier is changed.

2. The anomaly detection device as claimed in claim 1, wherein the anomaly detector determines that the contact failure of the movable terminal has occurred upon determining that a transition time of the output voltage detected by the voltage detector is greater than or equal to a threshold when the applied voltage applied by each of the first applier and the second applier is changed.

3. The anomaly detection device as claimed in claim 1, wherein the first voltage is supplied by a first voltage source, and the second voltage is supplied by a second voltage source; and when the output voltage detected by the voltage detector in the first detection period is the second voltage, the anomaly detector determines that a short circuit has occurred between the movable terminal and the second voltage source.

4. The anomaly detection device as claimed in claim 1, wherein the first voltage is supplied by a first voltage source, and the second voltage is supplied by a second voltage source; and when the output voltage detected by the voltage detector in the second detection period is the first voltage, the anomaly detector determines that a short circuit has occurred between the movable terminal and the first voltage source.

5. The anomaly detection device as claimed in claim 1, wherein in a third detection period, the first applier applies the second voltage, and the second applier applies the first voltage; and the anomaly detector determines that a short circuit has occurred between the movable terminal and the one end of the resistor when the output voltage detected by the voltage detector in the first detection period is the first voltage and the output voltage detected by the voltage detector in the third detection period is the second voltage.

6. The anomaly detection device as claimed in claim 1, wherein in a third detection period, the first applier applies the second voltage, and the second applier applies the first voltage; and the anomaly detector determines that a short circuit has occurred between the movable terminal and the another end of the resistor when the output voltage detected by the voltage detector in the second detection period is the second voltage and the output voltage detected by the voltage detector in the third detection period is the first voltage.

7. The anomaly detection device as claimed in claim 1, wherein the anomaly detector determines that the movable terminal is separated from the resistor when the output voltage detected by the voltage detector in the first detection period or the second detection period is neither the first voltage nor the second voltage.

8. The anomaly detection device as claimed in claim 1, wherein the anomaly detection device is implemented by a micro control unit (MCU); and at least one of the first applier, the second applier, and the voltage detector is an input port or an output port of the MCU.

9. A anomaly detection method for a potentiometer including a resistor and a movable terminal that moves while contacting the resistor, the anomaly detection method comprising:

applying a first voltage to one end and another end of the resistor;

applying a second voltage to the one end and the another end of the resistor; and detecting a contact failure of the movable terminal based on an output voltage of the movable terminal at a time when an applied voltage applied to the resistor is changed.

* * * * *